United States Patent Office
2,772,159
Patented Nov. 27, 1956

2,772,159

LIGHT SENSITIVE COMPOSITION OF MATTER AND PHOTOGRAPHIC METHOD USING IT

Stanley B. Elliott, Shaker Heights, Ohio, assignor to Ferro Corporation, Cleveland, Ohio, a corporation of Ohio No Drawing. Application February 18, 1953, Serial No. 337,662

18 Claims. (Cl. 96—27)

This invention relates as indicated to a new composition of matter and has more particular reference to photosensitive resins and method of making same.

It is well known to those skilled in the art that the formation of images in photosensitive compositions is dependent upon the degeneration of silver salts therein. In the photosensitive systems of the present invention the formation of images is not dependent upon the degeneration of silver salts as in the prior art, but is dependent upon the degradation of a halogenated resin to form a molecule containing five or more conjugated double bonds.

Therefore, it is a principal object of this invention to provide a new composition of matter comprising a resin system which is photosensitive to actinic light.

Another object of this invention is to provide a photosensitive resin system capable of producing a latent image upon exposure to actinic light and which image can be "developed" and "fixed" without the use of external chemicals.

A further object of this invention is to provide a photosensitive resin system which can be "developed" and "fixed" by light and heat alone.

Other objects will appear as the description proceeds.

To the accomplishment of the foregoing and related ends the invention, then comprises the features hereinafter fully described and pointed out in the claims, the following description setting forth in detail certain illustrative embodiments of the invention, these being indicative, however, of but a few ways in which the principle of the invention may be employed.

Broadly stated this invention comprises a new composition of matter consisting essentially of an intimate admixture of:

(*a*) A substantially straight chain organic halogenated resin having a molecular weight of at least 6000 capable of dehydrohalogenation upon exposure to actinic light at room temperatures and able at elevated temperatures in the presence of a Friedel-Crafts catalyst to undergo dehydrohalogenation with the formation of at least 5 conjugated double bonds per molecule;

(*b*) A minor amount of a substance selected from the class consisting of Friedel-Crafts type catalysts and Friedel-Crafts type catalyst progenitors; and (*c*) A minor amount of a silver salt wherein the affinity of the silver for its anion is lower than the affinity of silver for the halogen ions of the resin under the influence of actinic light.

As previously stated the formation of images in prior art photosensitive compositions is dependent upon the degeneration of the silver salts contained therein. I have found that various halogenated resins can be degenerated to form their own chromophore groups.

Since the compositions and processes of the present invention are different than ordinarily encountered by those skilled in the art of photosensitive compositions the following definitions are offered so as to avoid any confusion that might arise:

Cure: The time necessary to obtain solvation of the resin film so that it can be handled.

Exposure: The treatment of the photosensitive resin layer under an actinic light source to produce a latent image.

Development: The heat treatment of the light exposed photosensitive resin layer so as to make the latent image apparent.

Latent image: The area exposed to a suitable actinic light source.

Image: The area exposed to the actinic light and then developed by the action of heat.

Ground: The undeveloped area around the image.

Safety factor: The time between the appearance of the image and the darkening of the ground during the development operation.

Actinic light: The term actinic light as used in the present specification is meant to include any electro-magnetic wave in the range of visible light.

In the foregoing broad statement the basic component of the composition has been defined as a halogenated resin capable of dehydrohalogenation with the formation of at least 5 conjugated double bonds per molecule. The compounds which may be used for this purpose must:

(*a*) Have a sufficiently high molecular weight so as to be resinous in character (a molecular weight of at least 6000);

(*b*) They must be substantially straight-chain; and (*c*) They must contain halogen.

In further explanation of the above, it should be noted that whereas there are found in their natural state as in petroleum straight-chain organic compounds, there are none which in their natural state have a sufficiently high molecular weight so as to be resinous and possess the physical properties required of the basic material of the present invention. It is accordingly necessary to form such compounds and this is done by the polymerization of relatively low molecular weight compounds and because of its activity ethylene is the source of most of such polymers. The sufficiently high molecular weight material may thus be produced by polymerizing ethylene and since the resultant product should contain replaceable halogen, it is convenient to begin with a halogen containing material such as vinyl chloride. It is of course possible also to form a comparable and useable molecule by the polymerization of ethylene to produce a polyethylene of sufficiently high molecular weight which then may be chlorinated; however, this route is not recommended because ethylene containing no halogen, being less active than vinyl chloride, requires extremely drastic conditions in order to effect polymerization. Pressures on the order of more than 1,000 atmospheres and appropriate catalysts being needed in addition to high temperatures in order to produce the unchlorinated polyethylene.

Instead of using only the homo-polymer of ethylene chloride or vinyl chloride, other polymers may be used which will produce equivalent structures. Thus, for example, in addition to vinyl chloride homopolymers there may be used vinylidene chloride homopolymers as well as co-polymers of vinyl chloride and vinylidene chloride. The presence of other groups such as esters which do not interfere with dehydrohalogenation are not objectionable so that co-polymers of vinyl chloride for example with vinyl acetate may readily be used.

The compound used as the basic material, which for the reasons explained above is for practical purposes a polymer, must in addition contain a straight-chain of substantial length in the molecule so that upon dehydrohalogenation the molecule will contain at least 5 and preferably 10 or more conjugated double bonds. This requirement is met admirably by the vinyl chloride polymers and copolymers referred to above as well as halogenated polyethylene. For convenience in the identification of this class of materials, resort may be had to the term vinylogs as defined by R. S. Fuson in his "The Principles of Vinylogy," Chemical Review 16, 1 (1935). The materials which are thus useful as the basic material may be defined as polymers of vinylogous series which contain a straight-chain of at least 5 and preferably 10 or more carbon atoms and which are halogenated to the extent so that upon dehydrohalogenation they will yield substituent groups having 5 and preferably 10 or more conjugated double bonds. Stated in another way, the basic materials used in the production of the present composition are halogenated vinylogous resins. These resins all have the property of degrading by means of dehydrohalogenation when exposed to heat and/or light. If held at room temperatures and without the presence therein of a stabilizer, they will degrade in color but at a relatively slow rate. If subjected to actinic light and/or heat, such rate of degradation is moderately accelerated. However, these resins when intimately admixed with components (*b*) and (*c*) as defined in the aforementioned broad statement, and then subjected to actinic light and heat undergo rapid dehydrohalogenation with the formation of at least 5 conjugated double bonds.

In the broad statement of the invention, component (*b*) has been defined as a Friedel-Crafts type catalyst or a Friedel-Crafts type catalyst progenitor which in the presence of heat promotes the dehydrohalogenation of component (*a*) to the extent that at least 5 and preferably 10 or more conjugated double bonds are formed. The materials which are used for this purpose are not required in an amount stoichiometrically to combine with the halide released from the basic material, consequently component (*b*) serves catalytically to promote the dehydrohalogenation of the basic material.

As is well-known to those skilled in the art, that while aluminum chloride is the best known of the Friedel-Crafts type catalysts many other metal halides are also used as Friedel-Crafts type catalysts. Among those that may be listed as the more important Friedel-Crafts type catalysts are the halides of iron, antimony, zinc, tin, titanium, zirconium, beryllium, boron, cadmium and bismuth. Therefore, the halides of any of the foregoing metals will be useful in the compositions of the present invention.

While the above mentioned Friedel-Crafts type catalysts are useful in the present compositions, in the preferred embodiment of the present invention it is desirable to use what is known as Friedel-Crafts type catalyst progenitors. The Friedel-Crafts progenitors are any organic or inorganic salts which contain, for example any of the above mentioned metals and which in the presence of halide ions will form Friedel-Crafts type catalysts by reaction with the halide ions. The following Friedel-Crafts type catalysts progenitor compounds have been found to be especially useful in the present invention:

| | |
|---|---|
| Zinc acetate | Cadmium naphthenate |
| Zinc laurate | Cadmium laurate |
| Zinc naphthenate | Cadmium stearate |
| Zinc stearate | Cadmium sulfate |
| Zinc oleate | Aluminum acetate |
| Zinc 2-ethyl hexoate | Aluminum chlorolaurate |
| Zinc oxide | Bismuth naphthenate |
| Zinc sulfate | Antimony naphthenate |
| Zinc sulfide | Beryllium stearate |
| Cadmium acetate | Iron naphthenate |
| Cadmium oxide | Iron oleate |

The foregoing Friedel-Crafts progenitors are preferred since with their use it is possible to control the color differential (safety factor) between the image and the ground during the development operation. The catalyst raises the energy level of the resin molecule due to excitation upon contact with the catalyst. Thus, if a metal halide is used directly in the resin, the degradation is rapid and when the composition is heat developed after exposure to actinic light the degradation is so rapid as to make it extremely difficult to control the color difference between the light struck and non-light struck areas. However, if a catalyst progenitor is used the safety factor is greater. In other words, if the resin is intimately admixed with a catalyst progenitor and then exposed to actinic light the resin undergoes dehydrohalogenation and the released halide ions react with the surrounding catalyst progenitor to form a Friedel-Crafts type catalyst. Thus there is formed, in the light struck area, the Friedel-Crafts type catalyst, while the surrounding non-light exposed area contains only the catalyst progenitor. Then when the composition is subjected to the heat development operation, the light struck area undergoes very rapid degradation due to the presence of the Friedel-Crafts type catalyst while the non-light struck area remains relatively colorless until the catalyst progenitor is converted to the actual catalyst. The heating is stopped before the Friedel-Crafts type catalyst is formed in the ground in sufficient concentration to cause the formation of chromophore groups and the resultant image is thus distinct from the ground.

The concentration of the Friedel-Crafts type catalyst or the Friedel-Crafts type catalyst progenitor may vary from about 0.1% to about 25% of the weight of the halogenated resin used in the system.

Component (*c*) as previously mentioned in the aforegoing broad statement is a silver salt which in the presence of actinic light is raised to such an energy level as to promote dehydrohalogenation of the resin. The salts which are used for this purpose are not required in an amount stoichiometrically to combine with the hydrogen halides released from the resin, but these compounds (*c*) or their degradation products serve catalytically to "zipper off" hydrogen halide from the resin. The compounds which have been found to be particularly useful for this purpose are certain photosensive silver salts wherein the affinity of the silver for its anion is lower than the affinity of silver for the halogen ions of the basic resins, under the influence of actinic light. Therefore the employment of a compound (*c*) material which is photosensitive and thus reaches an energy level effective to catalyze the dehydrohalogenation by chain reaction of the basic material is best suited for this purpose. Thus when the photosensive system is exposed to actinic light the silver salt causes the formation of a maximum amount of hydrogen halide which in turn reacts with the Friedel-Crafts type catalyst progenitor to form Friedel-Crafts type catalysts which catalyze the formation of chromophore groups in the resin molecule during the heat development operation.

Such inorganic silver salts as:

Silver carbonate
Silver oxide
Silver phosphate when incorporated in the photosensitive systems of the present invention will cause the removal by chain reaction of hydrohalides when the compositions are exposed to actinic light. However, in the preferred embodiment of my invention I use organic silver compounds, such as silver salts of organic acids, phenols and mercaptans. Such compounds as:

Silver naphthenate
Silver acetate
Silver stearate
Silver octoate
Silver salt of 2 hydroxy 1,4,naptho-quinone are typical examples of the preferred silver compounds.

The concentration of the silver compounds may be varied from about 1% to about 25% of the resin weight.

While it is preferred to use vinyl chloride polymers or copolymers in order to obtain good physical properties in the film, it is entirely practical to use other chlorinated resins. Thus, the following resins have been used and produced entirely satisfactory images by the mechanism of this invention:

Vinyl chloride polymers
Vinylidene chloride polymers
Vinyl chloride-vinylidene chloride copolymers
Vinyl chloride-vinyl acetate copolymers However, it is entirely within the contemplation of this invention to use any halogenated resin capable of dehydrohalogenation as previously discussed. In addition I have also found that if such groups as $NR_2$, NHR, $NH_2$, OH and $OCH_3$ known to possess auxochromic activity in the presence of conjugated double bonds, are substituted in the resin molecule in place of hydrogen on the carbon next to that carbon carrying the chlorine, a more intense image may be obtained.

The following examples are offered to illustrate the foregoing discussion:

I 50 grams polyvinyl chloride
4 grams zinc naphthenate
2 grams silver naphthenate
20 grams dioctyl phthalate
10 grams diluent The above ingredients were thoroughly mixed, and then poured onto a plate and a 4 mil film drawn down. The film was then cured at about 350° F. for about 1 minute. Although a cure time is not essential to the mechanism of the invention, the film is cured so that it will not be sticky, and thus facilitate handling. The film was then masked with a negative and exposed for about 2 minutes to an actinic light source of 120 milliwatts per square centimeter of surface. The exposed film was then developed at about 320° F. for about 15 minutes. The finished film was a clear and positive picture of the negative.

It will be noted that in the foregoing and subsequent examples a diluent is used when admixing the ingredients of the present photosensitive systems. Depending on the preferred mechanical handling of the film, it may prove desirable to prepare either a plastisol, organosol, or a solution type of coating. While a diluent has been used in the various examples it is not a necessary part of the formulation since if it is desired to make a plastisol no diluent is used. An organosol would have an inactive type diluent, such as a paraffinic type hydrocarbon and a solution would make use of a true solvating diluent, such as a ketone. In every case the ratio of ingredients must be adjusted to produce the desired workable viscosity.

As the aforegoing example (I) uses an exposure of about 2 minutes to an actinic light source of 120 milliwatts per square centimeter of surface, it is to be understood that this exposure is only a typical example of how the photosensitive systems may be exposed. It is well known to those skilled in the art that resin monomers may be completely polymerized by addition polymerization to large size polymers within a period of one-thousandth of a second. It is also well known to those skilled in the art that depolymerization will take place under that same span of time with suitable conditions. These polymerizations can be actively initiated by very small quantities of energy. The converse also holds true that these polymerized aggregates may be degraded by similar small amounts of energy. It is therefore within the contemplation of this invention to produce latent images in my photosensitive systems using an exposure time of one-thousandth of a second with an actinic light source on the order of two milliwatts per square centimeter of exposed surface. In the preferred embodiment of this invention I use a resin system which will produce latent images when exposed for about 5 seconds at about 120 milliwatts per square centimeter of exposed surface. I prefer this method of exposure since it is the most convenient commercial method of handling the photosensitive systems. However, it is to be noted that the above mentioned times of exposure and energy source are useable.

The exposure of the photosensitive films of this invention may be carried out under any source of electromagnetic waves in the range from ultra-violet through visible light.

The development of the latent image is normally carried out at the temperatures recommended by the resin manufacturers for the processing of vinyl film. These temperatures range from 200° F. to 500° F. over a period of from 1 to 60 minutes.

The same procedure as discussed above in Example I was repeated using different resins, such as, vinyl chloride ester copolymer, vinyl chloride-vinyl-idene copolymer resin, polyvinylidene chloride resin, etc. All of these resins worked equally well as the polyvinyl chloride.

II 50 grams polyvinyl chloride
10 grams cadmium naphthenate
4 grams silver octoate
20 grams dioctyl phthalate
10 grams diluent A film was made and treated as in Example I with the same results noted. The same formulation was also repeated using different resins, as noted above. All of the resins worked in the presence of the cadmium naphthenate and silver octoate.

III 50 grams polyvinyl chloride
5 grams aluminum chlorolaurate
2 grams silver cumate
20 grams dioctyl phthalate
10 grams diluent A film was made and treated as in the foregoing examples with the same results noted. The same formulation was also repeated using different resins as noted above.

IV 50 grams polyvinyl chloride
5 grams iron naphthenate
2 grams silver stearate
20 grams dioctyl phthalate
10 grams diluent A film was made and treated as in the foregoing examples with the same results noted. The same formulation was also repeated using different resins as noted above.

As for the plasticizers used in the foregoing examples, while dioctyl phthalate is preferred, a wide choice of plasticizers or mixtures of plasticizers is possible. The choice is substantially dependent upon the physical properties desired in the final film. The following materials are typical examples of plasticizers which may be used:

Dioctyl phthalate
Tricresyl phosphate
Tributyl Cellosolve phosphate
Triethylene glycol di-2, ethyl hexoate
Di-2, ethyl hexyl adipate.

The amount of plasticizer may vary from 0 to about 100 parts per 50 parts of resin depending upon the solubility characteristics of the resin, the type of plasticizer and the type of film desired. The following examples illustrate the extreme variation on plasticizer usable in the present invention.

V 50 grams polyvinyl chloride resin
50 grams diluent
0 grams plasticizer
4 grams zinc oxide
2 grams silver naphthenate

VI 50 grams polyvinyl chloride resin
10 grams diluent
100 grams dioctyl phthalate
4 grams zinc oxide
2 grams silver naphthenate In both cases a good dark image was obtained following exposure and development. In the case of Example V above the film was dry and brittle and in the case of Example VI the film was very soft and pliable.

In order for the photosensitive systems of the present invention to function it is necessary that the Friedel-Crafts type catalyst or the catalyst progenitor be thoroughly and uniformly distributed throughout the resin. Several possible methods of accomplishing this are as follows:

(*a*) If the catalytic agent is soluble in the system it may be added directly to the other components and mixed by mechanical agitation.

(*b*) The catalytic agent, if insoluble in the composition, may be mixed and ground into the composition on a three roll paint mill or other similar type mill.

(*c*) The catalytic agent may be dissolved in any suitable liquid. The resin may then be added to this solution, mixed thoroughly and the solvent evaporated, leaving the resin coated with the catalytic agent.

(*d*) In addition to the above methods, a vinyl film may be made and the catalytic agent deposited on the surface thereof and allowed to soak down into the film, thus allowing the catalytic agent to come into intimate contact with the resin particles and thus forming a photosensitive film.

The photosensitve systems of this invention can be further modified by the addition of (*a*) agents which increase or amplify the color of the light struck areas, (*b*) agents which increase the safety factor during the development step and (*c*) agents which permit the reproduction of half-tones.

(*a*) To increase or amplify the color of the light struck areas, an acid-base sensitive dye (indicator) soluble or dispersible in the system may be added. For example, if crystal violet indicator is added to the formula of Example I the surplus halogen acid or acid acting salt (zinc chloride) will then cause the typical indicator color change in the light struck area when the total acidity of the system reaches the proper level.

(*b*) compounds of high light instability or halogen acid instability, which may or may not give color in themselves, can be used as a source of halogen acid for conversion of a Friedel-Crafts type catalyst progenitor. Such materials as chlorinated paraffins, chlorinated rubber, alpha or beta chlorostyrene readily release their halogens when exposed to light. Thus photosensitive compositions of the present invention containing any of these above materials when exposed to actinic light will release hydrogen chloride and convert the catalyst progenitor to the active catalyst, thus giving a much higher concentration of catalyst at the start of the development operation. This in turn gives a greater safety factor or a longer time between the image development and the darkening of the ground. Compounds such as these may be present in the amounts of from about 5% to about 100% of the weight of the resin.

An example of such a composition is as follows:

VII 50 grams vinyl chloride polymer
10 grams dioctyl phthalate 4 grams zinc naphthenate
20 grams chlorinated paraffin
2 grams silver naphthenate
10 grams diluent Films of this formulation where exposed to a light source for 10 minutes had a safety factor of 11 minutes where the film was developed at 350° F. In other words, there was a time lapse of 11 minutes between the full development of the image and the darkening of the ground.

The images developed by the aforegoing compositions are black and white rather than half-tones. Chemical or physical barriers within the systems described will prevent extensive, uncontrolled degradation of the system. The migration of hydrogen halides and Friedel-Crafts catalytically active molecules are controlled by these spacers or barriers and thus limit the degradation of the resins substantially to those areas actually exposed to light.

The following examples will serve to illustrate various methods of formulation using phyiscal barriers to obtain half-tone reproductions in the photosensitive systems previously disclosed.

VIII 50 grams vinyl chloride polymer
20 grams dioctyl phthalate
4 grams zinc oxide
2 grams silver starate
10 grams diluent
20 grams talc

IX 50 grams vinyl chloride polymer
20 grams dioctyl phthalate
4 grams zinc oxide
2 grams silver naphthenate
10 grams diluent
20 grams talc

X 50 grams vinyl chloride polymer
10 grams dioctyl phthalate
4 grams zinc oxide
2 grams silver naphthenate
20 grams chlorinated paraffin
10 grams diluent
20 grams talc Other pigments or inert materials may be used in place of the talc For example mica, silica, diatomaceous earth, and titanium dioxide when substituted for talc in the above formulations resulted in films with excellent half-tones. Any finely divided inert solid particles may be used in amounts varying from about 1% to about 50% of the resin weight, as physical barriers or spacers to make possible the production of half-tones in the photosensitive compositions herein disclosed.

Active pigments, such as, calcium carbonate, basic lead sulfate, etc. may be used as "chemical spacers" in the aforegoing compositions to make possible the production of half-tones. For example in a system such as disclosed in Example VIII calcium carbonate may be substituted for the talc. Any halogen acid liberated from the resin during development which does not react with the catalyst progenitor, will be taken up by chemical reaction with the calcium carbonate, thus preventing the chain transfer from one resin particle to another. The "chemical spacers" may be used in the same amounts as the aforegoing "physical spacers."

In addition to the use of the foregoing chemical or physical barriers for the production of half-tones other modifications may be used. As for example, the resin of Examples VIII, IX, or X may be pretreated with an aqueous on non-aqueous solution of the catalyst progenitor. After drying the treated resin may be used in the formulations of Examples VIII, IX or X using untreated resin as the "spacer" in place of the talc. Also, the resin particles pretreated with the catalyst progenitor may be encapsulated or "potted" in a neutral resin. The action of sealing each treated resin particle from its neighbors cuts down on chain transfer, thus making possible the production of half-tones, since the degradation of each treated resin particle is then in proportion to the light energy absorbed by it.

In the following claims by vinyl resin I mean the homopolymers, copolymers and interpolymers of vinyl resins, vinylidene resins, vinyl substituted resins, and vinylidene substituted resins.

Other modes of applying the principle of the invention may be employed provided the features stated in any of the following claims or the equivalent of such be employed.

I, therefore, particularly point out and claim as my invention:

1. A composition of matter consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acid, the metals therein being selected from the class consisting of aluminum, zinc, tin, titanium, zirconium, beryllium, cadmium, bismuth, iron and antimony; and (*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone.

2. A composition of matter consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone; and (*d*) A plasticizer of the type commonly employed with halongenated vinyl resins present in the amount up to about 100 parts per 50 parts of said resin.

3. A composition of matter consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron, and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone; and (*d*) From about 5% to about 100% of the weight of said resin of a material selected from the class consisting essentially of chlorinated paraffins, chlorinated rubber, alpha-chlorostyrene and beta-chlorostyrene.

4. A composition of matter consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) From about 5% to about 100% of the weight of said resin of a material selected from the class consisting essentialy of chlorinated paraffins, chlorinated rubber, alpha-chlorostyrene and beta-chlorostyrene; and (*e*) A plasticizer of the type commonly employed with halogenated vinyl resins present in the amount up to about 100 parts per 50 parts of said resin.

5. A composition of matter consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) From about 5% to about 100% of the weight of said resin of a material selected from the class consisting essentially of chlorinated paraffins, chlorinated rubber, alpha-chlorostyrene and beta-chlorostyrene; and (*e*) From about 1% to about 50% of the weight of said resin of a finely divided material selected from the class consisting essentially of talc, mica, silica, diatomaceous earth, titanium dioxide, calcium carbonate and basic lead sulfate.

6. A composition of matter consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) From about 5 % to about 100% of the weight of said resin of a material selected from the class consisting essentially of chlorinated paraffins, chlorinated rubber, alpha-chlorostyrene and beta-chlorostyrene;

(*e*) From about 1% to about 50% of the weight of said resin of a finely divided material selected from the class consisting essentially of talc, mica, silica, diatomaceous earth, titanium dioxide, calcium carbonate and basic lead sulfate; and (*f*) A plasticizer of the type commonly employed with halogenated vinyl resins present in the amount up to about 100 parts per 50 parts of said resin.

7. A composition of matter consisting of an intimate admixture of:

(*a*) Polyvinyl chloride resin;

(*b*) From about 0.1% to about 25% of the weight of said resin of zinc oxide; and (*c*) From about 1% to about 25% of the weight of said resin of silver naphthenate.

8. A composition of matter consisting of an intimate admixture of:

(*a*) Polyvinyl chloride resin;

(*b*) From about 0.1% to about 25% of the weight of said resin of zinc oxide;

(*c*) From about 1% to about 25% of the weight of said resin of silver naphthenate; and (*d*) Up to about 100 parts per 50 parts of said resin of dioctyl phthalate.

9. A composition of matter consisting of an intimate admixture of:

(*a*) Polyvinyl chloride resin;

(*b*) From about 0.1% to about 25% of the weight of said resin of zinc oxide;

(*c*) From about 1% to about 25% of the weight of said resin of silver naphthenate;

(*d*) From about 5% to about 100% of the weight of said resin of chlorinated rubber.

10. A composition of matter consisting of an intimate admixture of:

(*a*) Polyvinyl chloride resin;

(*b*) From about 0.1% to about 25% of the weight of said resin of zinc oxide;

(*c*) From about 1% to about 25% of the weight of said resin of silver naphthenate;

(*d*) From about 5% to about 100% of the weight of said resin of chlorinated rubber; and (*e*) Up to 100 parts per 50 parts of said resin of dioctyl phthalate.

11. A composition of matter consisting of an intimate admixture of:

(*a*) Polyvinyl chloride resin;

(*b*) From about 0.1% to about 25% of the weight of said resin of zinc oxide;

(*c*) From about 1% to about 25% of the weight of said resin of silver naphthenate;

(*d*) From about 5% to about 100% of the weight of said resin of chlorinated rubber; and (*e*) From about 1% to about 50% of said resin of finely divided talc.

12. A composition of matter consisting of an intimate admixture of:

(*a*) Polyvinyl chloride resin;

(*b*) From about 0.1% to about 25% of the weight of said resin of zinc oxide;

(*c*) From about 1% to about 25% of the weight of said resin of silver naphthenate;

(*d*) From about 5% to about 100% of the weight of said resin of chlorinated rubber;

(*e*) From about 1% to about 50% of the weight of said resin of finely divided talc; and (*f*) Up to about 100 parts per 50 parts of said resin of dioctyl phthalate.

13. The process of making photographic images which comprises selectively exposing a photosensitive film to a light image in such a manner so as to create a light intensity gradient such that the area receiving maximum actinic light is exposed to about two milliwatts per square centimeter for one-thousandths of a second said photosensitive system consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony; and (*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone, and thereafter fully developing and fixing the image solely by submitting said film to a temperature of from about 200° F. to about 500° F. for a period of from about 1 to about 60 minutes.

14. The process of making photographic images which comprises selectively exposing a photosensitive film to a light image in such a manner so as to create a light intensity gradient such that the area receiving maximum actinic light is exposed to about two milliwatts per square centimeter for one-thousandth of a second said photosensitive system consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone; and (*d*) A plasticizer of the type commonly employed with halogenated vinyl resins present in the amount up to about 100 parts per 50 parts of said resin, and thereafter fully developing and fixing the image solely by submitting said film to a temperature of from about 200° F. to about 500° F. for a period of from about 1 to 60 minutes.

15. The process of making photographic images which comprises selectively exposing a photosensitive film to a light image in such a manner so as to create a light intensity gradient such that the area receiving maximum actinic light is exposed to about two milliwatts per square centimeter for one-thousandth of a second said photosensitive system consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) From about 5% to about 100% of the weight of said resin of a material selected from the class consisting essentially of chlorinated paraffins, chlorinated rubber, alpha-chlorostyrene and beta-chlorostyrene, and thereafter fully developing and fixing the image solely by submitting said film to a temperature of from about 200° F. to about 500° F. for a period of from about 1 to about 60 minutes.

16. The process of making photographic images which comprises selectively exposing a photosensitive film to a light image in such a manner so as to create a light intensity gradient such that the area receiving maximum actinic light is exposed to about two milliwatts per square centimeter for one-thousandth of a second said photosensitive system consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) A plasticizer of the type commonly employed with halogenated vinyl resins present in the amount up to about 100 parts per 50 parts of said resin; and (*e*) From about 5% to about 100% of the weight of said resin of a material selected from the class consisting essentially of chlorinated paraffins, chlorinated rubber, alpha-chlorostyrene and beta-chlorostyrene, and thereafter fully developing and fixing the image solely by submitting said film to a temperature of from about 200° F. to about 500° F. for a period of from about 1 to about 60 minutes.

17. The process of making photographic images which comprises selectively exposing a photosensitive film to a light image in such a manner so as to create a light intensity gradient such that the area receiving maximum actinic light is exposed to about two milliwatts per square centimeter for one-thousandth of a second said photosensitive system consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) From about 5% to about 100% of the weight of said resin of a material selected from the class consisting essentially of chlorinated paraffins, chlorinated rubber, alpha-chlorostyrene and beta-chlorostyrene; and (*e*) From about 1% to about 50% of the weight of said resin of a finely divided material selected from the class consisting of talc, mica, silica, diatomaceous earth, titanium dioxide, calcium carbonate and basic lead sulfate, and thereafter fully developing and fixing the image solely by submitting said film to a temperature from about 200° F. to about 500° F. for a period of from about 1 to about 60 minutes.

18. The process of making photographic images which comprises selectively exposing a photosensitive film to a light image in such a manner so as to create a light intensity gradient such that the area receiving maximum actinic light is exposed to about two milliwatts per square centimeter for one-thousandth of a second said photosensitive system consisting of an intimate admixture of:

(*a*) An organic halogenated vinyl resin having a molecular weight of at least 6,000;

(*b*) From about 0.1% to about 25% of the weight of said resin of a substance selected from the class consisting of the oxides of zinc and cadmium, metal salts of halogen free inorganic acids, and metal salts of carboxylic acids, the metals therein being selected from the class consisting of aluminum, zinc, tin, titanium, zirconium, beryllium, cadmium, bismuth, iron and antimony;

(*c*) From about 1% to about 25% of the weight of said resin of a sequestering agent selected from the class consisting of silver carbonate, silver oxide, silver phosphate, silver naphthenate, silver acetate, silver cumate, silver octoate, silver compounds of phenols, silver compounds of mercaptans, and the silver salt of 2-hydroxy 1,4 naphthoquinone;

(*d*) From about 5% to about 100% of the weight of said resin of a material selected from the class consisting essentially of chlorinated paraffins, chlorinated rubber, alpha-chlorostyrene and beta-chlorostyrene;

(*e*) A plasticizer of the type commonly employed with halogenated vinyl resins present in the amount up to about 100 parts per 50 parts of said resin; and (*f*) From about 0.1% to about 50% of the weight of said resin of a finely divided material selected from the class consisting of talc, mica, silica, diatomaceous earth, titanium dioxide, calcium carbonate and basic lead sulfate, and thereafter fully developing and fixing the image solely by submitting said film to a temperature from about 200° F. to about 500° F. for a period of from about 1 to about 60 minutes.

References Cited in the file of this patent

UNITED STATES PATENTS

| | | |
|---|---|---|
| 1,587,274 | Beebe et al. | June 1, 1926 |
| 2,099,297 | Clement | Nov. 16, 1937 |
| 2,473,548 | Smith | June 21, 1949 |
| 2,475,626 | Leatherman | July 12, 1949 |
| 2,538,297 | De Nie | Jan. 16, 1951 |